(12) United States Patent
Hayes

(10) Patent No.: US 6,486,805 B1
(45) Date of Patent: Nov. 26, 2002

(54) FREQUENCY TO DIGITAL CONVERTER

(75) Inventor: Eric Hayes, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/590,917

(22) Filed: Jun. 9, 2000

(51) Int. Cl.[7] .................................................. H03M 2/48
(52) U.S. Cl. ...................... 341/116; 341/120; 341/157; 341/164; 324/76.47; 324/76.55; 324/76.62; 702/78
(58) Field of Search .................................. 341/157, 164, 341/116, 120; 324/76.39, 76.41, 76.49, 76.77

(56) References Cited

U.S. PATENT DOCUMENTS

| | | | | |
|---|---|---|---|---|
| 3,668,690 A | * | 6/1972 | Ormond ...................... 341/157 |
| 3,685,043 A | * | 8/1972 | Kosakowski | |
| 4,025,868 A | * | 5/1977 | Miki et al. ................ 324/76.39 |
| 4,107,600 A | * | 8/1978 | McMannis ................. 324/78 R |
| 4,788,646 A | * | 11/1988 | Herzl ....................... 324/76.47 |
| 4,980,687 A | * | 12/1990 | Newell et al. ............... 341/157 |
| 5,070,333 A | * | 12/1991 | Marschall .................... 341/155 |
| 5,089,770 A | * | 2/1992 | Lee et al. .................. 324/78 D |
| 5,357,196 A | * | 10/1994 | Ito ............................... 324/166 |
| 5,396,247 A | * | 3/1995 | Watanabe et al. ........... 341/157 |
| RE34,899 E | * | 4/1995 | Gessaman et al. .......... 341/157 |
| 5,424,735 A | * | 6/1995 | Arkas et al. ................ 674/157 |
| 5,666,118 A | * | 9/1997 | Gersbach ..................... 341/120 |
| 6,111,533 A | * | 8/2000 | Yuan et al. .................. 341/155 |
| 6,215,434 B1 | * | 4/2001 | Roza ........................... 341/157 |

* cited by examiner

Primary Examiner—Michael Tokar
Assistant Examiner—Khai Nguyen
(74) Attorney, Agent, or Firm—Barnes & Thornburg

(57) ABSTRACT

According to an embodiment of the present invention, an input signal is provided to an oscillator, which creates a count signal with a greater frequency than the input signal. The input signal triggers the oscillator to oscillate depending on the value of the input signal. The oscillator output is provided to a counter, which counts the number of oscillations undergone by the oscillator during a single period of the input signal or a number of periods of the input signal, whichever is desired. Since the oscillator frequency is greater than the frequency of the input signal, the oscillator effectively acts like a clock to time the input signal; the counter effectively acts to record the 'time' measured by the oscillator (clock). More formally, the counter generates a count value based upon the width of the input signal pulses. The counter output is provided to a decoder, which interprets the count generated by the counter.

30 Claims, 3 Drawing Sheets

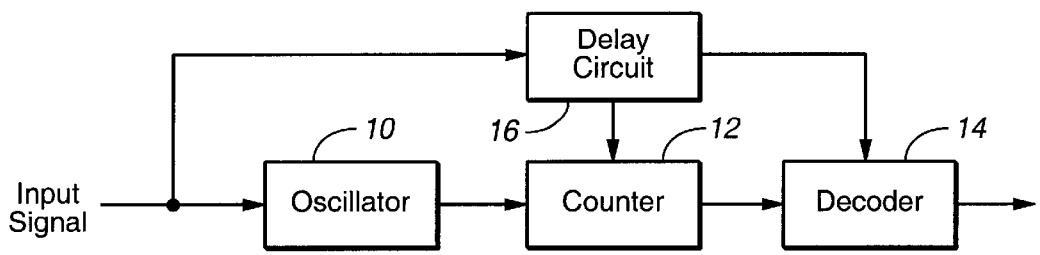
FIG._1
| Frequency Input | Counter Output | Decoder | | | |
|---|---|---|---|---|---|
| | | B0 | B1 | B2 | B4 |
| $f_0$ | 2 | 0 | 0 | 0 | 0 |
| $f_1$ | 4 | 0 | 0 | 0 | 1 |
| $f_2$ | 6 | 0 | 0 | 1 | 0 |
| $f_3$ | 8 | 0 | 0 | 1 | 1 |
| $f_4$ | 10 | 0 | 1 | 0 | 0 |
| $f_5$ | 12 | 0 | 1 | 0 | 1 |
| $f_6$ | 14 | 0 | 1 | 1 | 0 |
| $f_7$ | 16 | 0 | 1 | 1 | 1 |
| $f_8$ | 18 | 1 | 0 | 0 | 0 |
| $f_9$ | 20 | 1 | 0 | 0 | 1 |
| $f_{10}$ | 22 | 1 | 0 | 1 | 0 |
| $f_{11}$ | 24 | 1 | 0 | 1 | 1 |
| $f_{12}$ | 26 | 1 | 1 | 0 | 0 |
| $f_{13}$ | 28 | 1 | 1 | 0 | 1 |
| $f_{14}$ | 30 | 1 | 1 | 1 | 0 |
| $f_{15}$ | 32 | 1 | 1 | 1 | 1 |
FIG._2
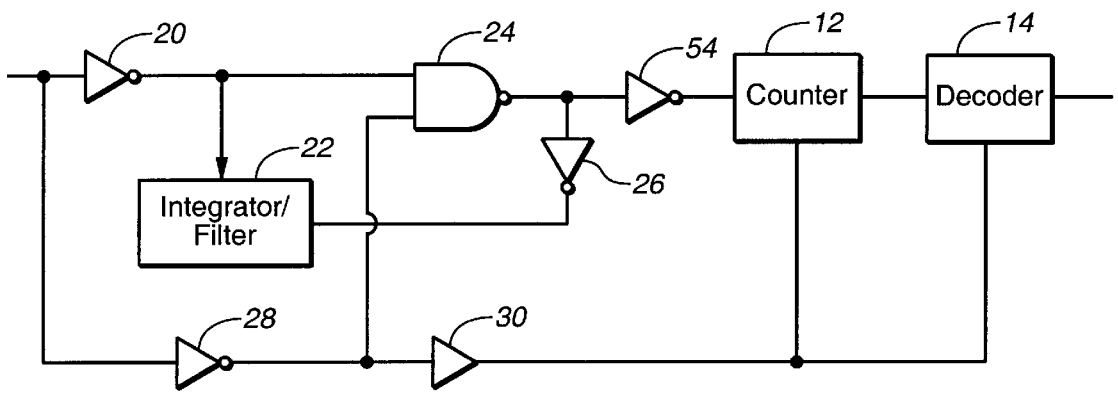
FIG._3

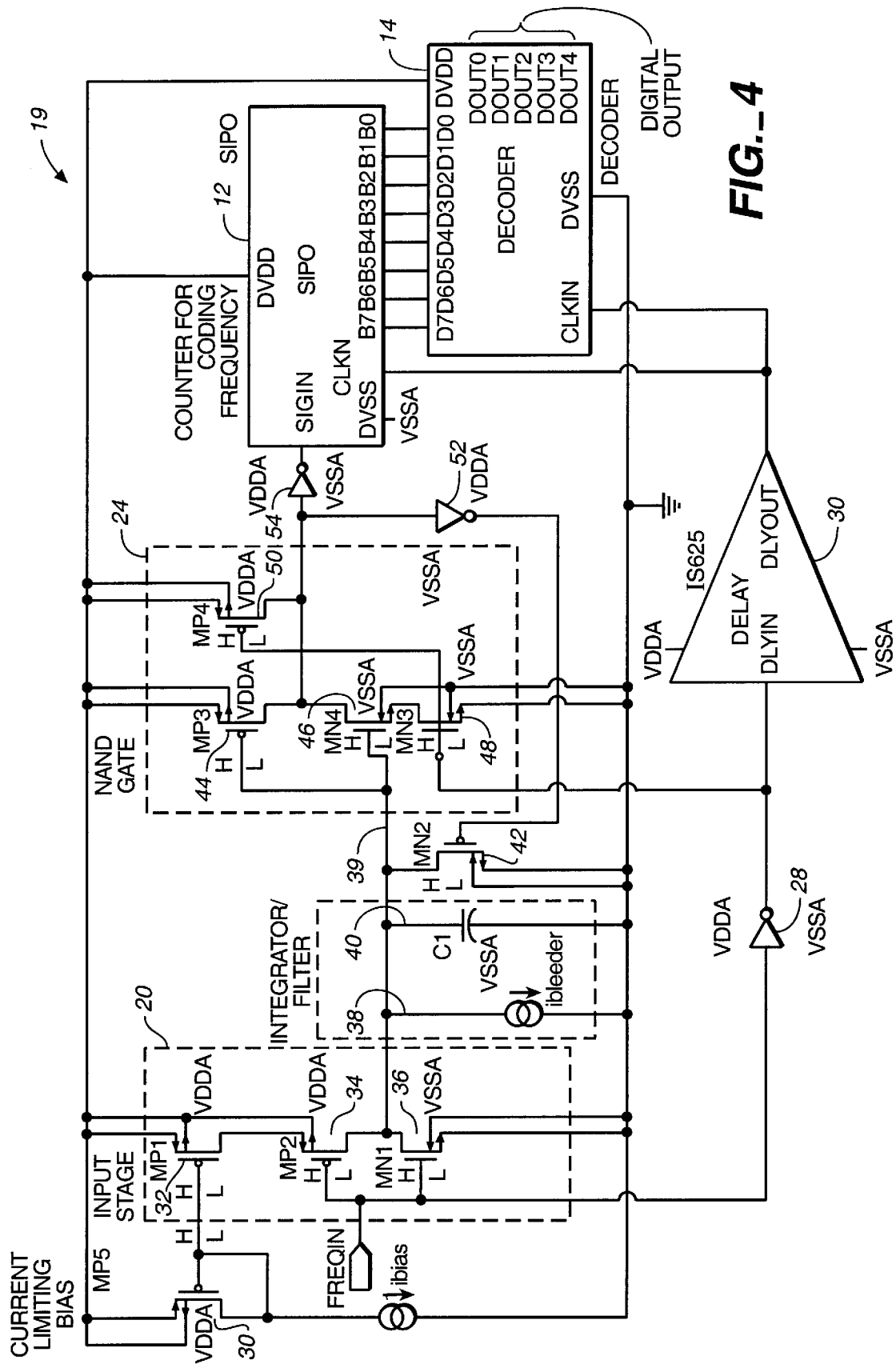
FIG._4

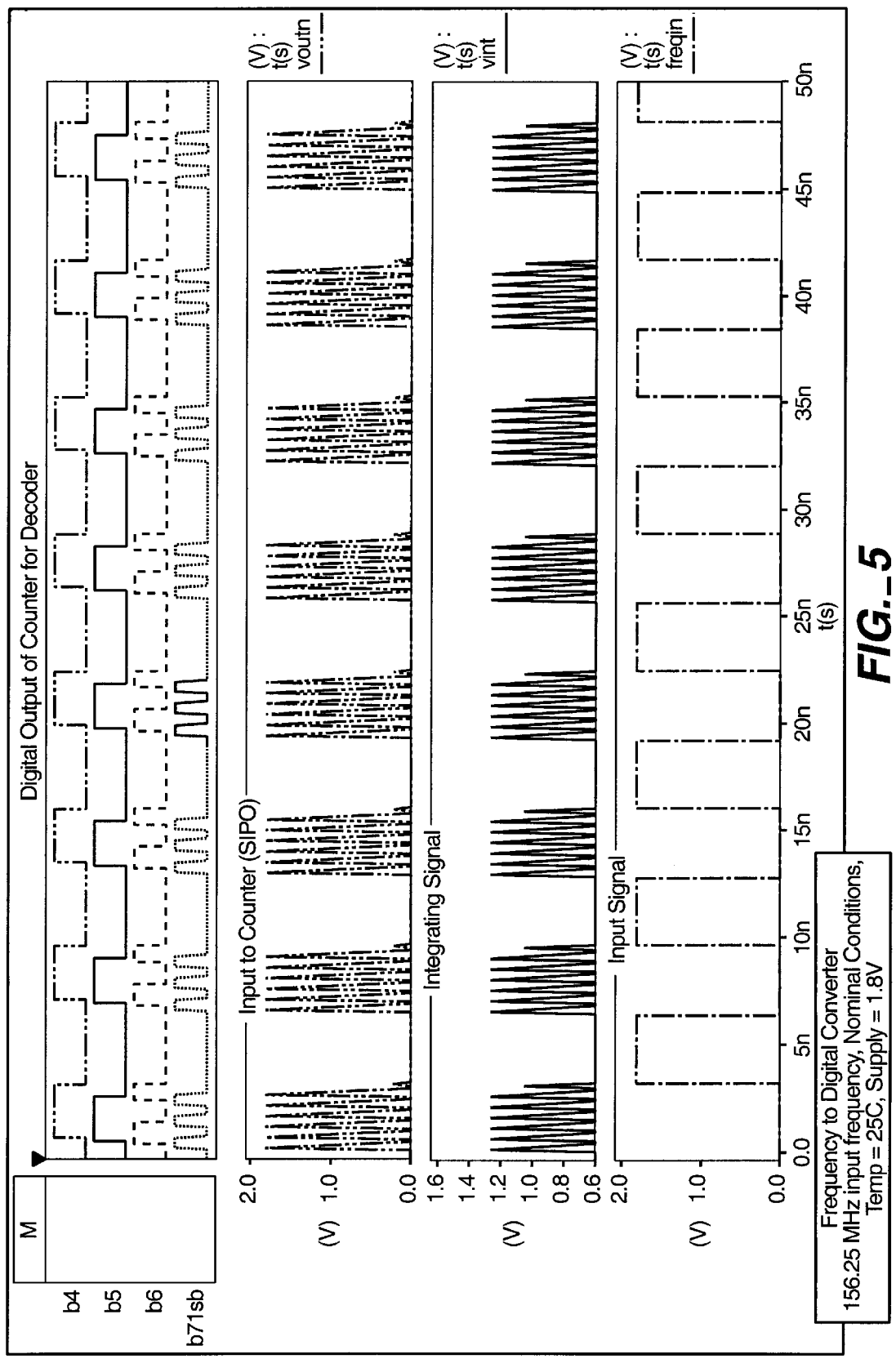
FIG._5

FREQUENCY TO DIGITAL CONVERTER

BACKGROUND OF THE INVENTION

1. Field of the Invention

This invention relates to methods and apparatus for determining the frequency of an electrical or electromagnetic signal.

2. Description of the Related Art

It is often necessary or useful to determine the frequency of an electrical or electromagnetic signal. One conventional way of measuring a signal's frequency is to time the signal with a known frequency generated by a stand-alone oscillator that is constantly in operation. However, oscillators consume power and require additional space on an integrated circuit. Therefore, it would be desirable to determine a frequency's signal without the use of an oscillator that is constantly in operation.

SUMMARY OF THE INVENTION

According to an embodiment of the present invention, an input signal is provided to an oscillator, which creates a count signal with a greater frequency than the input signal. The input signal triggers the oscillator to oscillate depending on the value of the input signal. Thus, unlike the conventional systems, the present invention does not employ an oscillator that continually generates a signal with a particular frequency. The oscillator output is provided to a counter, which counts the number of oscillations undergone by the oscillator during a single period of the input signal or a number of periods of the input signal, whichever is desired. Since the oscillator frequency is greater than the frequency of the input signal, the oscillator effectively acts like a clock to time the input signal; the counter effectively acts to record the 'time' measured by the oscillator (clock). More formally, the counter generates a count value based upon the width of the input signal pulses. The counter output is provided to a decoder, which interprets the count generated by the counter.

The input signal is provided to a delay circuit, which creates a delayed version of the input signal, which is provided to the counter. When the input signal has cycled through one period or a number of periods, whichever is desired, the output of the delay circuit changes, thereby resetting the counter so that it can begin to count for a new period or periods. The amount of delay provided by the delay circuit dictates the number of periods the counter counts before it is reset. Counting a number of periods allows an average frequency over those periods to be determined. Alternatively, if a single period is used to calculate the frequency, a number of frequencies as determined by the decoder may be averaged.

BRIEF DESCRIPTION OF THE DRAWINGS

Other objects and advantages of the invention will become apparent upon reading the following detailed description and upon reference to the accompanying drawings in which:

FIG. 1 is a block diagram of an embodiment of the present invention.

FIG. 2 shows a possible decoding scheme that correlates frequency to count values.

FIG. 3 shows a more detailed block diagram of a possible embodiment of the present invention.

FIG. 4 is a circuit diagram of one possible circuit that implements the embodiment shown in FIG. 3.

FIG. 5 is a timing diagram for the circuit shown in FIG. 4.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a block diagram of an embodiment of the present invention. As shown, an input signal is provided to an oscillator 10, which creates a count signal with a greater frequency than the input signal. As will be further described below, a change in value of the input signal triggers the oscillator 10 to oscillate. The oscillator 10 output is provided to a counter 12, which counts the number of oscillations undergone by the oscillator 10 during a single period of the input signal or a number of periods of the input signal, whichever is desired. Since the oscillator 10 frequency is greater than the frequency of the input signal, the oscillator 10 effectively acts like a clock to time the input signal; the counter 12 effectively acts to record the 'time' measured by the oscillator (clock) 10. More formally, the counter 12 generates a count value based upon the width of the input signal pulses, The counter 12 output is provided to a decoder 14, which interprets the count generated by the counter 12 and therefore estimates the frequency of the input signal. A possible table showing counter 12 output versus decoder 14 output is shown in FIG. 2.

The input signal is provided to a delay circuit 16, which creates a delayed version of the input signal, which is provided to the counter 12. When the input signal has cycled through one period or a number of periods, whichever is desired, the output of the delay circuit 16 changes, thereby resetting the counter 12 so that it can begin to count for a new period or periods. Alternatively, the counter 12 could cycle continuously (not be reset) and the decoder 14 could be clocked by the signal from the delay circuit. In this case, the decoder 14 could subtract the count value of a previous input signal period (or periods) from the count value of a current input signal period (or periods) to derive the proper count for the intput signal period (or periods).

The amount of delay provided by the delay circuit 16 dictates the number of periods the counter 12 counts before it is reset; if it is desired to count over one period of the input signal, the delay is equal to the delay that results from passing the input signal through whatever circuitry processes the input signal before it reaches the counter 12. Alternatively, if it is desired to count over more than one period of the input signal, the delay circuit 16 may comprise a frequency divider circuit. Frequency divider circuits are known in the art.

Counting a number of periods allows an average frequency over those periods to be determined. Alternatively, if a single period is used to calculate the frequency, the determined frequencies for a number of different input signal periods may be averaged.

FIG. 3 shows a more detailed block diagram of a possible embodiment of the present invention. As shown, the input signal is provided to an inverter 20, whose output is provided across an integrator/filter 22 to an input of a nand gate 24. A feedback circuit 26 feeds back the output of the nand gate 24; the feedback circuit 26 and the integrator/filter 22 correspond to the oscillator 10 shown in FIG. 1. An inverter 54 inverts the nand gate 24 output and provides the inverted output to the counter 12. The delay circuit 16 (FIG. 1) is implemented in FIG. 3 as an inverter 28 and a (non-inverting) buffer 30, in series. The output of inverter 28 is the second input to the nand gate 24. The output of the nand gate 24 provided to the counter 12, which is reset by a changing edge of the delayed version of the input signal.

FIG. 4 is a circuit diagram of one possible circuit 19 that implements the embodiment shown in FIG. 3. A current mirror comprising p-channel transistors 30 and 32 charges a capacitor 40 through a p-channel transistor 34 when the input signal is low. When the input signal is low, an n-channel transistor 36 is off. (The p-channel transistor 34 in series with the n-channel transistor 36 corresponds to the inverter 20 in FIG. 3). The capacitor 40 is coupled between a node 39 and ground so that node 39 is pulled up to a high voltage as the capacitor 40 charges. When the input signal is low, the p-channel transistor 34 is off and the n-channel transistor 36 is on, which drives the voltage at node 39 to a low value.

P-channel transistor 44 s coupled in series with n-channel transistors 46 and 48 to form the nand gate 24. The gates of transistors 46 and 48 are coupled to node 39. A current generator 38 may be coupled in parallel with capacitor. The gate to transistor 48 is coupled to the output of the inverter 28. A p-channel transistor 50 is coupled between a voltage high line and node 51.

The inverter 54 inverts the output at node 51 and provides the inverted output to the counter 12 input. An inverter 52 inverts the output at node 51 and provides the inverted output to the gate of an n-channel transistor 42, which is coupled between node 39 and ground.

The operation of the circuit 19 will be described more completely in light of FIG. 5, which is a timing diagram for the circuit shown in FIG. 4. FIG. 5 shows the input signal, which is assumed to be a square wave, the voltage at node 39, the input to the counter 12, and the output of decoder 14. As can immediately be seen, the timing is performed when the input signal is low. In other words, the decoder 14 is calibrated based upon the number of pulses that are counted in ½ of the cycle of the input signal.

When the input signal is high, transistor 34 (see FIG. 4) is off and the voltage at node 39 is low. The voltage at node 51 is correspondingly high and the input to the counter 12 is correspondingly low. The n-channels 42 and 48 are off. The circuit 19 is thus in a stable state and no counting occurs.

When the input signal goes low, p-channel 34 turns on, and charges capacitor 40, as can be seen in FIG. 5. Also, the voltage at the gate of the n-channel 48 goes from low to high. When the capacitor 40 charges to the point where node 39 reaches the threshold voltage for p-channels 44 and 46, they turn off, so the n-channel 48 pulls node 51 low. The output of the inverter 52 then goes from low to high so that node 51 goes from high to low, turning on transistor 42, which discharges the capacitor 40. This in turn pulls node 39 lower, which in turn pulls node 51 higher, which results in the output of the inverter 52 going low. Thus, the n-channel is again turned off and the capacitor 40 recharges through the p-channel 34, thus resulting in a repetition of the above described cycle. The cycles continue as long as the input signal stays low.

The high to low to high voltage at node 51 during the above cycle results in a pulse at the output of the inverter 54, as shown in FIG. 5. Each pulse increases the count of the counter 12 by 1. Since the frequency of the signal at the input of the counter 12 is known (i.e. the count signal frequency), the frequency of the input signal is determined by the count accumulated by the counter 12 over 1 or more input signal periods. The optimal count signal frequency depends on the application; a higher count frequency will be more accurate at the cost of greater power consumption. A preferred count frequency range for fiber channel related applications is 20 MHz–250 MHz.

It will be appreciated that the present invention is not restricted to square input waves.

CONCLUSION

Numerous variations and modifications will become apparent to those skilled in the art once the above disclosure is fully appreciated. It is intended that the following claims be interpreted to embrace all such variations and modifications.

What is claimed is:

1. A frequency to digital converter for estimating the frequency of an input signal comprising a plurality of pulses and characterized by an input signal frequency, each of the pulses having a corresponding pulse width, the converter comprising:
    an oscillator circuit for generating a count signal comprising a plurality of pulses and characterized by an oscillator frequency that is greater than the input signal frequency, the oscillator circuit configured to begin oscillating upon a change in value of the input signal;
    a counter with an input and an output, the input of the counter coupled to the oscillator circuit such that the counter counts pulses of the count signal, thereby generating a count value; and
    a decoder with an input and an output, the input of the decoder coupled to the output of the counter, the decoder configured to estimate the frequency of input signal based upon the count value.

2. A frequency to digital converter for estimating the frequency of an input signal comprising a plurality of pulses and characterized by an input signal frequency, each of the pulses having a corresponding pulse width, the converter comprising:
    an oscillator circuit for generating a count signal comprising a plurality of pulses and characterized by an oscillator frequency that is greater than the input signal frequency, the oscillator circuit configured to begin oscillating upon a change in value of the input signal;
    a counter with an input and an output, the input of the counter coupled to the oscillator circuit such that the counter counts pulses of the count signal, thereby generating a count value; and
    a decoder with an input and an output, the input of the decoder coupled to the output of the counter, the decoder configured to estimate the frequency of input signal based upon the count value,
    wherein the oscillator frequency is determined solely by semiconductor based circuit elements.

3. The converter of claim 2 wherein the decoder is calibrated to estimate the frequency of the input signal frequency based upon one period of the input signal.

4. The converter of claim 2 wherein the decoder is calibrated to estimate the frequency of the input signal frequency based upon more than one period of the input signal.

5. The converter of claim 2 wherein the oscillator circuit is configured to oscillate when the input signal has a first value, wherein the oscillator circuit is configured not to oscillate when the input signal has a second value.

6. The converter of claim 5 wherein the first value is lower than the second value.

7. The converter of claim 5 wherein the oscillator circuit comprises a feedback circuit that operates to change the oscillator output from a first voltage to a second voltage upon the oscillator output reaching a threshold value.

8. The converter of claim 5 wherein the oscillator circuit comprises a capacitor, coupled between a first node and a second node, that is configured such that it charges to a threshold voltage and is then discharged, thereby generating a count pulse.

9. The converter of claim 7 further comprising a current source coupled in parallel with the capacitor.

10. The converter of claim 8 further comprising:
a nand gate with a plurality of inputs and an output, wherein one of the inputs to the nand gate is coupled to the first node such that the output of the nand gate changes when the capacitor is charged to the threshold value, thereby creating the start of a pulse,
a first inverter with an input and an output, the input of the first inverter coupled to the output of the nand gate, wherein the output of the first inverter is coupled to the input of the counter.

11. The converter of claim 8 further comprising an input circuit comprising an inverter with an input and an output, the input coupled to receive the input signal, the output coupled to the first node such that the inverter chargers the capacitor at least a portion of the time when the input signal has a first value and such that the inverter does not charge the capacitor at any time when the input signal has a second value, thereby allowing the oscillator to oscillate when the input signal has a first value and preventing the oscillator from oscillating when the input signal when the input signal has a second value.

12. The converter of claim 10 further comprising a delay circuit with an input and an output, the input of the delay circuit coupled to receive the input signal and the output of the delay circuit is coupled to the counter such that the counter is reset based upon a change in value of a signal provided by the delay circuit; wherein the delay circuit comprises a plurality of delay buffers, each of the delay buffers having an input and an output, and wherein the output of a first one of the delay buffers is coupled to one of the inputs of the nand gate.

13. The converter of claim 12 wherein the first one of one of the delay buffers comprises an inverter.

14. The converter of claim 10 further comprising a discharging circuit coupled in parallel with the capacitor, the discharging circuit coupled to the output of the nand gate such that the discharging circuit discharges the capacitor when the output of the nand gate changes.

15. The converter of claim 14 further comprising a second inverter coupled to the output of the nand gate, wherein the discharging circuit comprises a CMOS transistor coupled in parallel with the capacitor, and whose gate is coupled to the output of the second inverter.

16. A frequency to digital converter for estimating the frequency of an input signal comprising a plurality of pulses and characterized by a input signal frequency, each of the pulses having a corresponding pulse width, the converter comprising:
an oscillator circuit for generating a count signal comprising a plurality of pulses and characterized by an oscillator frequency that is greater than the input signal frequency, wherein the oscillator circuit is configured such that it does not oscillate for at least a portion of a period of the input signal;
a counter with an input and an output, the input of the counter coupled to the oscillator circuit such that the counter counts pulses of the count signal, thereby generating a count value; and
a decoder with an input and an output, the input of the decoder coupled to the output of the counter, the decoder configured to estimate the frequency of the input signal based upon the count value.

17. The converter of claim 16 wherein the oscillator frequency is determined solely by semiconductor based circuit elements.

18. The converter of claim 16 wherein the oscillator circuit is configured to oscillate when the input signal has a first value, wherein the oscillator circuit is configured not to oscillate when the input signal has a second value.

19. The converter of claim 16 wherein the decoder is calibrated to estimate the frequency of the input signal based upon one period of the input signal.

20. The converter of claim 16 wherein the decoder is calibrated to estimate the frequency of the input signal based upon more than one period of the input signal.

21. The converter of claim 18 wherein the first value is lower than the second value.

22. The converter of claim 21 further comprising a current source coupled in parallel with the capacitor.

23. The converter of claim 18 wherein the oscillator circuit comprises a feedback circuit that operates to change the oscillator output from a first voltage to a second voltage upon the oscillator output reaching a threshold value.

24. The converter of claim 18 wherein the oscillator circuit comprises a capacitor, coupled between a first node and a second node, that is configured such that it charges to a threshold voltage and is then discharged, thereby generating a count pulse.

25. The converter of claim 18 further comprising:
a nand gate with a plurality of inputs and an output, wherein one of the inputs to the nand gate is coupled to the first node such that the output of the nand gate changes when the capacitor is charged to the threshold value, thereby creating the start of a pulse,
a first inverter with an input and an output, the input of the first inverter coupled to the output of the nand gate,
wherein the output of the first inverter is coupled to the input of the counter.

26. The converter of claim 18 further comprising an input circuit comprising an inverter with an input and an output, the input coupled to receive the input signal, the output coupled to the first node such that the inverter chargers the capacitor at least a portion of the time when the input signal has a first value and such that the inverter does not charge the capacitor at any time when the input signal has a second value, thereby allowing the oscillator to oscillate when the input signal has a first value and preventing the oscillator from oscillating when the input signal when the input signal has a second value.

27. The converter of claim 26 further comprising a delay circuit with an input and an output, the input of the delay circuit coupled to receive the input signal and the output of the delay circuit is coupled to the counter such that the counter is reset based upon a change in value of a signal provided by the delay circuit; wherein the delay circuit comprises a plurality of delay buffers, each of the delay buffers having an input and an output, and wherein the output of a first one of the delay buffers is coupled to one of the inputs of the nand gate.

28. The converter of claim 27 wherein the first one of one of the delay buffers comprises an inverter.

29. The converter of claim 27 further comprising a discharging circuit coupled in parallel with the capacitor, the discharging circuit coupled to the output of the nand gate such that the discharging circuit discharges the capacitor when the output of the nand gate changes.

30. The converter of claim 27 further comprising a second inverter coupled to the output of the nand gate, wherein the discharging circuit comprises a CMOS transistor coupled in parallel with the capacitor, and whose gate is coupled to the output of the second inverter.

* * * * *